(12) United States Patent
Chun

(10) Patent No.: US 10,573,398 B1
(45) Date of Patent: Feb. 25, 2020

(54) FUSE LATCH OF SEMICONDUCTOR DEVICE

(71) Applicant: SK hynix Inc., Icheon-si, Gyeonggi-do (KR)

(72) Inventor: Duk Su Chun, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/215,205

(22) Filed: Dec. 10, 2018

(30) Foreign Application Priority Data

Sep. 14, 2018 (KR) .......................... 10-2018-0110489

(51) Int. Cl.
*G11C 17/16* (2006.01)
*G11C 17/18* (2006.01)
*H01L 23/525* (2006.01)
*G11C 29/00* (2006.01)

(52) U.S. Cl.
CPC .............. *G11C 17/16* (2013.01); *G11C 17/18* (2013.01); *G11C 29/787* (2013.01); *G11C 29/789* (2013.01); *H01L 23/5256* (2013.01)

(58) Field of Classification Search
CPC ....... G11C 17/16; G11C 17/18; G11C 29/787; G11C 29/789; H01L 23/5256
USPC ........................................... 327/525, 564–566
See application file for complete search history.

(56) References Cited

U.S. PATENT DOCUMENTS

| 7,646,651 | B2 * | 1/2010 | Lee ........................ H01L 27/092 365/154 |
| 8,178,903 | B2 * | 5/2012 | Nakamura ............ H01L 27/092 257/206 |
| 9,281,082 | B1 | 3/2016 | Lee et al. |
| 9,379,689 | B2 * | 6/2016 | Kim ................. H03K 3/356104 |
| 9,397,640 | B2 * | 7/2016 | Chi ...................... G11C 11/4125 |

FOREIGN PATENT DOCUMENTS

| KR | 100256249 B1 | 5/2000 |
| KR | 1020160074914 A | 6/2016 |

* cited by examiner

*Primary Examiner* — Tomi Skibinski
(74) *Attorney, Agent, or Firm* — William Park & Associates Ltd.

(57) ABSTRACT

A fuse latch of a semiconductor device is disclosed. The fuse latch includes a plurality of PMOS transistors and a plurality of NMOS transistors to latch fuse cell data. In the fuse latch, the PMOS transistors are formed in a single P-type active region, and the NMOS transistors are arranged in a two-stage structure at one side of the P-type active region.

12 Claims, 6 Drawing Sheets

FUSE LATCH OF SEMICONDUCTOR DEVICE

CROSS-REFERENCE TO RELATED APPLICATION

The present application claims priority under 35 U.S.C. § 119(a) to Korean patent application No. 10-2018-0110489, filed on Sep. 14, 2018, the disclosure of which is incorporated herein in its entirety.

BACKGROUND OF THE INVENTION

Embodiments of the present disclosure relate to a semiconductor device, and more particularly to a fuse latch for latching information of a repair fuse cell.

With rapid development of higher-performance electronic systems (e.g., personal computers (PCs) and electronic communication systems), semiconductor devices acting as memory mounted to the electronic systems have been developed to implement products having higher speeds and higher degrees of integration.

In order to implement semiconductor devices having higher degrees of integration, a function for efficiently arranging memory cells of a memory cell region within a limited region is of importance. However, another function related to efficiently arranging a peripheral circuit region (hereinafter referred to as a peripheral region) that is needed to operate memory cells is more important than the function related to efficiently arranging memory cells of a memory cell region.

Many fuse-related circuits for repairing memory cells have been widely used in semiconductor devices. Therefore, the technology of efficiently arranging such fuse-related circuits to attain a regional gain of semiconductor devices is also of importance.

BRIEF SUMMARY OF THE INVENTION

Various embodiments of the present disclosure are directed to providing a fuse latch of a semiconductor device that substantially mitigates or obviates one or more problems due to limitations and disadvantages of the related art.

An embodiment of the present disclosure relates to a fuse latch capable of improving a regional gain of a semiconductor device.

In accordance with an aspect of the present disclosure, a fuse latch of a semiconductor device includes first and second NMOS transistors, each of which is configured to receive a first control signal through its gate terminal and to transmit fuse cell data in response to the first control signal. The fuse latch also includes a first inverter including a first PMOS transistor and a third NMOS transistor that are coupled in series between a power-supply voltage and a ground voltage, the first inverter configured to include an input node and an output node such that the input node is coupled to the first NMOS transistor and the output node is coupled to the second NMOS transistor. The fuse latch further includes a second inverter including a second PMOS transistor and a fourth NMOS transistor that are coupled in series between the power-supply voltage and the ground voltage, the second inverter configured to include an input node and an output node such that the input node is coupled to the output node of the first inverter and the output node is coupled to the input node of the first inverter. The fuse latch additionally includes a fifth NMOS transistor including a gate terminal and a first terminal such that the gate terminal is coupled to the output node of the first inverter and coupled to the input node of the second inverter and the first terminal is coupled to a data output terminal. The fuse latch also includes and a sixth NMOS transistor configured to receive a second control signal through its gate terminal and configured to selectively couple the ground voltage to a second terminal of the fifth NMOS transistor in response to the second control signal. The first and second PMOS transistors are formed in a first active region, the first to fourth NMOS transistors are formed in a second active region located at one side of the first active region in a first direction, and the fifth and sixth transistors are formed in a third active region located at one side of the second active region in the first direction.

In accordance with another aspect of the present disclosure, a fuse latch of a semiconductor device is disclosed. The fuse latch includes a plurality of PMOS transistors and a plurality of NMOS transistors to latch fuse cell data. The PMOS transistors are formed in a single P-type active region, and the NMOS transistors are formed in a plurality of N-type active regions. The plurality of N-type active regions may be arranged in a two-stage structure at one side of the P-type active region.

It is to be understood that both the foregoing general description and the following detailed description of embodiments are for purposes of explanation and not intended to be exhaustive.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference is now made to presented embodiments of the present disclosure, examples of which are illustrated in the accompanying drawings. Wherever possible, the same reference numbers are used throughout the drawings to refer to the same or like parts.

In association with the presented embodiments of the present disclosure, specific structural and functional descriptions are disclosed only for illustrative purposes. The presented embodiments represent a limited number of possible embodiments. Embodiments of the present disclosure can be implemented in various ways without departing from the scope or spirit of the present disclosure.

In describing the present disclosure, the terms "first" and "second" may be used to distinguish multiple components from one another, but the components are not limited by the terms in number or order. For example, a first component may be called a second component and a second component may be called a first component without departing from the scope of the present disclosure.

The terms used in the present application are merely used to describe specific embodiments and are not intended to limit the present disclosure. A singular expression may include a plural expression unless explicitly stated otherwise.

Unless otherwise defined, all terms used herein, including technical or scientific terms, have the same meanings as understood by those skilled in the art. Terms defined in a generally used dictionary may be analyzed to have the same meaning as the context of the relevant art and should not be analyzed to have an ideal meaning or an excessively formal meaning unless clearly defined in the present application. The terminology used in the present disclosure is for the purpose of describing particular embodiments only and is not intended to limit the disclosure.

Figure 1:
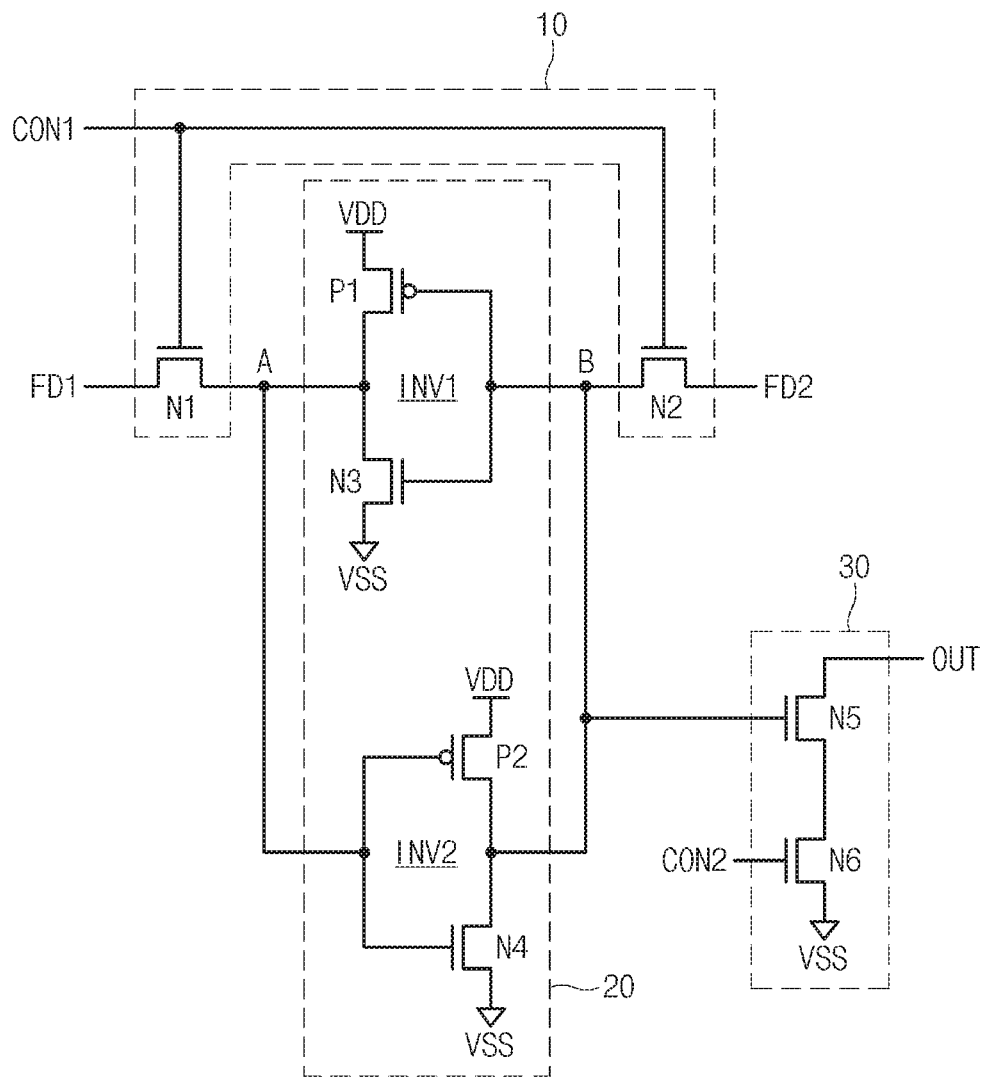
FIG. 1 shows a schematic diagram of a circuit structure of a fuse latch, according to an embodiment of the present disclosure.

FIG. 1 shows a schematic diagram illustrating a circuit structure of a fuse latch 1, according to an embodiment of the present disclosure.

Referring to FIG. 1, the fuse latch 1 may include a fuse information transmission circuit 10, a latch circuit 20, and a data output circuit 30.

The fuse information transmission circuit 10 may transmit fuse cell data FD1 and FD2 to the latch circuit 20 in response to a control signal CON1. In this case, a value of first fuse cell data FD1 is opposite to a value of second fuse cell data FD2. For example, if a phase of the first fuse cell data FD1 is at a high level (H), a phase of the second fuse cell data FD2 is at a low level (L). The fuse information transmission circuit 10 may include pass NMOS transistors N1 and N2.

The NMOS transistor N1 may include a gate terminal configured to receive the control signal CON1 as an input signal, a first terminal coupled to a first output terminal so as to receive first fuse cell data FD1 as an input signal, and a second terminal coupled to the latch circuit 20 through a node A. The NMOS transistor N2 may include a gate terminal configured to receive the control signal CON1 as an input signal, a first terminal coupled to a second output terminal of a fuse cell (not shown) so as to receive second fuse cell data FD2 as an input signal, and a second terminal coupled to the latch circuit 20 through a node B.

The latch circuit 20 may latch fuse cell data FD1 and FD2 received through the fuse information transmission circuit 10. The latch circuit 20 may include first and second inverters INV1 and INV2. Input and output (I/O) terminals of the first inverter INV1 may be coupled to input and output (I/O) terminals of the second inverter INV2 such that I/O signals of the first inverter INV1 and I/O signals of the second inverter INV2 may be fed back to each other.

The first inverter INV1 may include a PMOS transistor P1 and an NMOS transistor N3 that are coupled in series between a power-supply voltage (VDD) terminal and a ground voltage (VSS) terminal. A gate terminal of the PMOS transistor P1 and a gate terminal of the NMOS transistor N3 may be commonly coupled to a second terminal of the NMOS transistor N2 through a node B. A first terminal of the PMOS transistor P1 may be coupled to the power-supply voltage (VDD) terminal, and a second terminal of the PMOS transistor P1 may be coupled to a second terminal of the NMOS transistor N3. A first terminal of the NMOS transistor N3 may be coupled to the ground voltage (VSS) terminal, and a second terminal of the NMOS transistor N3 may be coupled to the second terminal of the PMOS transistor P1. That is, a specific node to which the second terminal of the PMOS transistor P1 and the second terminal of the NMOS transistor N3 are commonly coupled may be an output node (i.e., Node A) of the first inverter INV1, such that this output node (Node A) may be coupled to the second terminal of the NMOS transistor N1. A specific node to which the PMOS transistor P1 and the NMOS transistor N3 are commonly coupled may be an input node (i.e., Node B), such that this input node (Node B) may be coupled to the second terminal of the NMOS transistor N2.

The second inverter INV2 may include a PMOS transistor P2 and an NMOS transistor N4 that are coupled in series between the power-supply voltage (VDD) terminal and the ground voltage (VSS) terminal. A gate terminal of the PMOS transistor P2 and a gate terminal of the NMOS transistor N4 may be commonly coupled to a second terminal of the NMOS transistor N1 through the node A. A first terminal of the PMOS transistor P2 may be coupled to the power-supply voltage (VDD) terminal, and a second terminal of the PMOS transistor P2 may be coupled to a second terminal of the NMOS transistor N4. A first terminal of the NMOS transistor N4 may be coupled to the ground voltage (VSS) terminal, and a second terminal of the NMOS transistor N4 may be coupled to the second terminal of the PMOS transistor P2. That is, a specific node to which the second terminal of the PMOS transistor P2 and the second terminal of the NMOS transistor N4 are commonly coupled may be an output node (i.e., Node B) of the second inverter INV2, such that this output node (Node B) may be coupled to the second terminal of the NMOS transistor N2. A specific node to which the PMOS transistor P2 and the NMOS transistor N4 are commonly coupled may be an input node (i.e., Node A), such that this input node (Node A) may be coupled to the second terminal of the NMOS transistor N1.

The data output circuit 30 may output data latched by the latch circuit 20 in response to a control signal CON2. The data output circuit 30 may include NMOS transistors N5 and N6 coupled in series between a data output terminal OUT and a ground voltage (VSS) terminal.

The NMOS transistor N5 may include a gate terminal coupled to the node B, a first terminal coupled to the data output terminal OUT, and a second terminal coupled to the NMOS transistor N6. The NMOS transistor N6 may include a gate terminal configured to receive the control signal CON2 as an input signal, a first terminal coupled to the ground voltage (VSS) terminal, and a second terminal coupled to the second terminal of the NMOS transistor N5.

Figure 2:
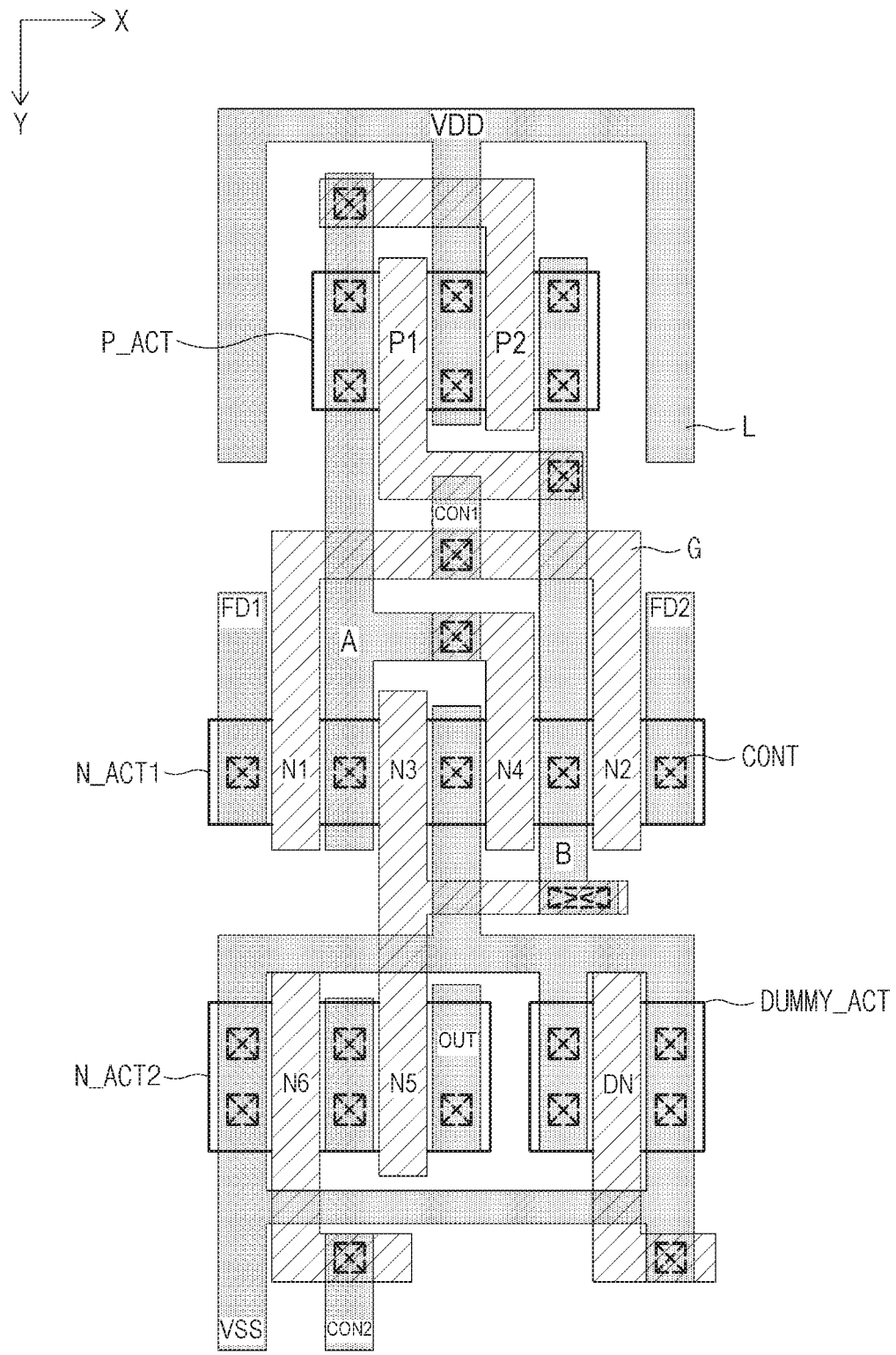
FIG. 2 shows a conceptual diagram illustrating an actual layout structure of constituent elements contained in the fuse latch shown in FIG. 1, according to an embodiment of the present disclosure.

FIG. 2 shows a conceptual diagram illustrating an actual layout structure of constituent elements contained in the fuse latch 1 shown in FIG. 1, according to an embodiment of the present disclosure.

For convenience of description and better understanding of the present disclosure, reference numerals indicating the PMOS transistors P1 and P2 and the NMOS transistors N1 to N6 of FIG. 1 are illustrated in gates of the corresponding transistors as shown in FIG. 2.

Referring to FIG. 2, the PMOS transistors P1 and P2 of the latch circuit 20 may be formed in a single P-type active region P_ACT. In other words, for an embodiment, the two PMOS transistors P1 and P2 contained in the two inverters INV1 and INV2, respectively, may share a single active region P_ACT.

For an embodiment, the NMOS transistors N1 and N2 of the fuse information transmission circuit 10 and the NMOS transistors N3 and N4 of the latch circuit 20 may be formed to share a single N-type active region N_ACT1. The NMOS transistors N5 and N6 of the data output circuit 30 may be formed to share another N-type active region N_ACT2. In this case, the N-type active region N_ACT1 may be located at one side of a P-type active region P_ACT in a first direction (e.g., a Y-axis direction), and the other N-type active region N_ACT2 may be located at one side (i.e., an opposite side of the P-type active region P_ACT) of the N-type active region N_ACT1 in the first direction.

That is, in each fuse latch (unit fuse latch) 1, the NMOS transistors N1 to N6 may be formed in two N-type active regions N_ACT1 and N_ACT2, and the PMOS transistors P1 and P2 may be formed in one P-type active region P_ACT1. In this case, because the N-type active regions N_ACT1 and N_ACT2 may be arranged in a two-stage structure at one side of the P-type active region P_ACT1, the active regions P_ACT, N_ACT1, and N_ACT2 may be arranged to have a P-N-N structure.

In the N-type active region N_ACT1, first terminals of the NMOS transistors N1 and N2 configured to respectively receive first fuse cell data FD1 and second fuse cell data FD2 may be arranged at both ends of the N-type active region N_ACT1. Through the above-indicated structure, if the fuse latches 1 are arranged in an array shape, adjacent fuse latches 1 may share a terminal (i.e., a signal transmission line) to which the first fuse cell data FD1 and the second fuse cell data FD2 are input.

In addition, power lines to supply the power-supply voltage VDD and the ground voltage VSS may be arranged at both sides of each fuse latch. Through the above-indicated structure, if the fuse latches 1 are arranged in an array shape, adjacent fuse latches may share the corresponding power lines.

A dummy active region DUMMY_ACT for facilitating a fabrication process may be formed at one side of the N-type active region N_ACT2 in a second direction (e.g., an X-axis direction) perpendicular to the first direction. A dummy NMOS transistor DN may be formed in the dummy active region DUMMY_ACT. A gate terminal, a first terminal, and a second terminal of the dummy NMOS transistor DN may be coupled to the ground voltage (VSS) terminal. The dummy active region DUMMY_ACT can be formed of not formed as necessary.

As is evident from FIG. 2, lines through which signals FD1, FD2, CON1, and CON2 are transmitted and lines (L) through which voltages VDD and VSS are transmitted may be formed of metal lines composed of M0 metal layer. In addition, the above-mentioned lines may be coupled to the gate G or the active regions P_ACT, N_ACT1, and N_ACT2 through a contact CONT.

Figure 3:
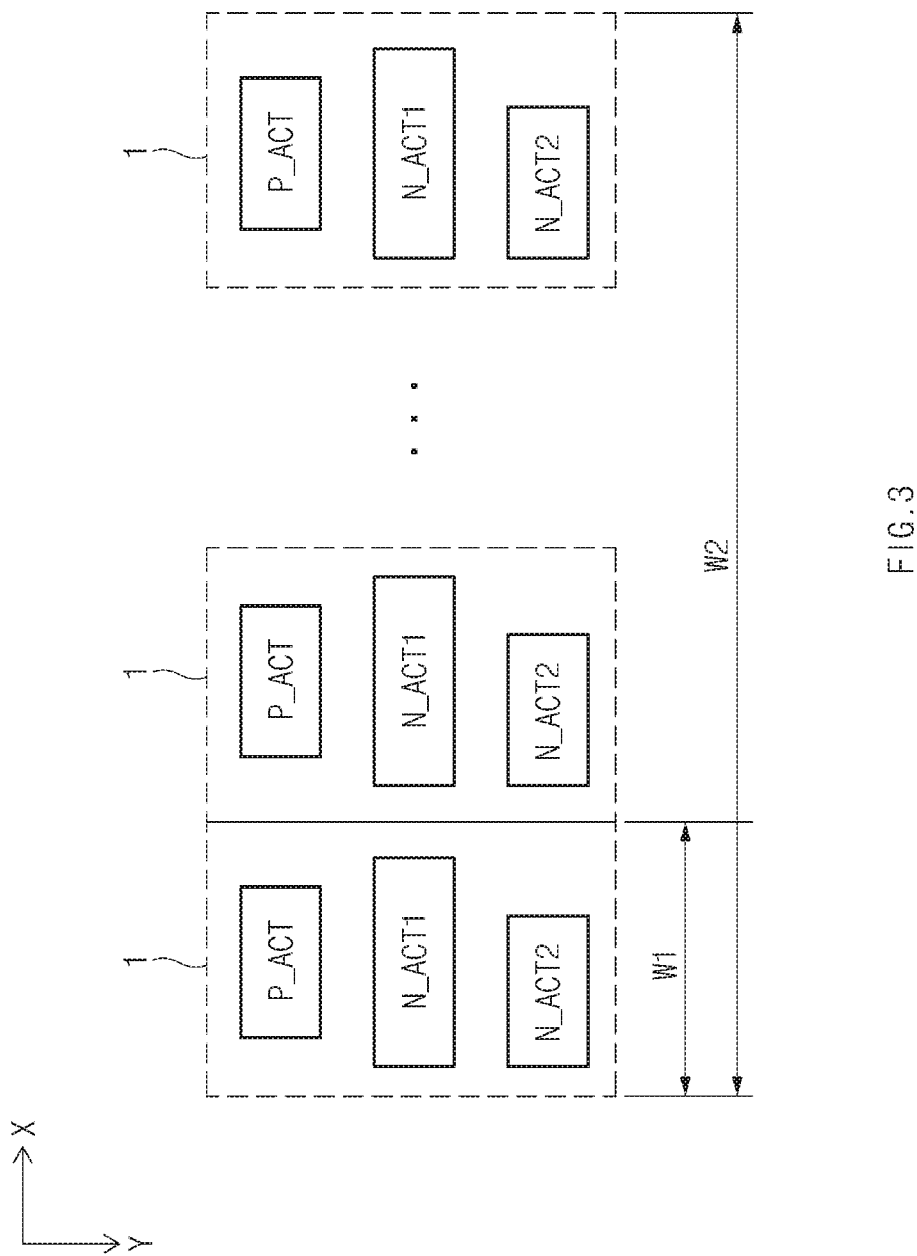
FIG. 3 shows a conceptual diagram illustrating a layout structure of active regions of unit fuse latches (shown in FIG. 2) arranged in an array shape, according to an embodiment of the present disclosure.

FIG. 3 shows a conceptual diagram illustrating a layout structure of active regions of unit fuse latches (shown in FIG. 2) arranged in an array shape, according to an embodiment of the present disclosure.

Referring to FIG. 3, each unit fuse latch 1 may include a P-type active region P_ACT and N-type active regions N_ACT1 and N_ACT2 arranged in a first direction (Y-axis direction). In more detail, the P-type active region P_ACT, the N-type active region N_ACT1, and the N-type active region N_ACT2 may be sequentially arranged in the first direction (Y-axis direction), resulting in formation of a P-N-N structure arranged in the first direction. A fuse latch array may include a plurality of unit fuse latches 1 arranged in a line in a second direction (X-axis direction) perpendicular to the first direction (Y-axis direction).

As described above, active regions of each unit fuse latch 1 may be arranged to have a P-N-N structure, resulting in reduction in a width (W1) of the unit fuse latch 1. Specifically, if the unit fuse latches 1 are arranged in a line as an array shape, a width (W2) of the fuse latch array can be greatly reduced.

Figure 4:
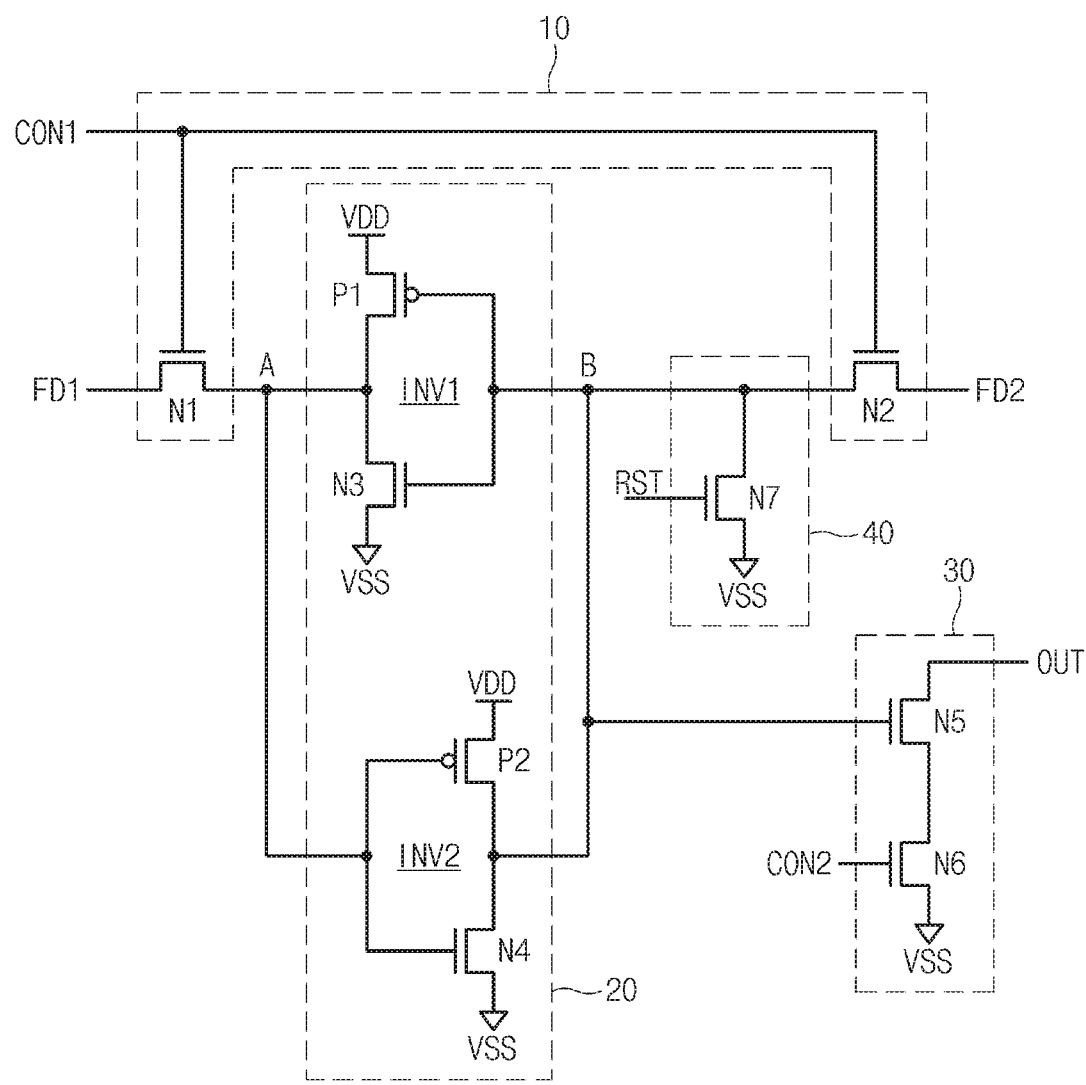
FIG. 4 shows a schematic diagram illustrating a circuit structure of a fuse latch, according to an embodiment of the present disclosure.

FIG. 4 shows a schematic diagram illustrating a circuit structure of a fuse latch 2, according to an embodiment of the present disclosure. For convenience of description, when possible, the same reference numerals are used throughout the drawings to refer to the same or like parts.

Referring to FIG. 4, the fuse latch 2 may include a fuse information transmission circuit 10, a latch circuit 20, a data output circuit 30, and an initialization circuit 40.

That is, the fuse latch 2 shown in FIG. 2 may further include the initialization circuit 40 as compared to the fuse latch 1 shown in FIG. 1.

The fuse information transmission circuit 10, the latch circuit 20, and the data output circuit 30 shown in FIG. 4 are identical in structure to those of FIG. 1, and as such, a detailed description of these components is omitted here for brevity.

The initialization circuit 40 may initialize a node B using a ground voltage (VSS) level in response to a reset signal RST. The initialization circuit 40 may include an NMOS transistor N7 coupled between the node B and the ground voltage (VSS) terminal.

The NMOS transistor N7 may include a gate terminal configured to receive the reset signal RST as an input signal, a first terminal coupled to the ground voltage (VSS) terminal, and a second terminal coupled to the node B.

As described above, the fuse latch 2 shown in FIG. 4 may include the initialization circuit 40, such that the fuse latch 2 may initialize fuse information at a desired time point using the initialization circuit 40.

Figure 5:
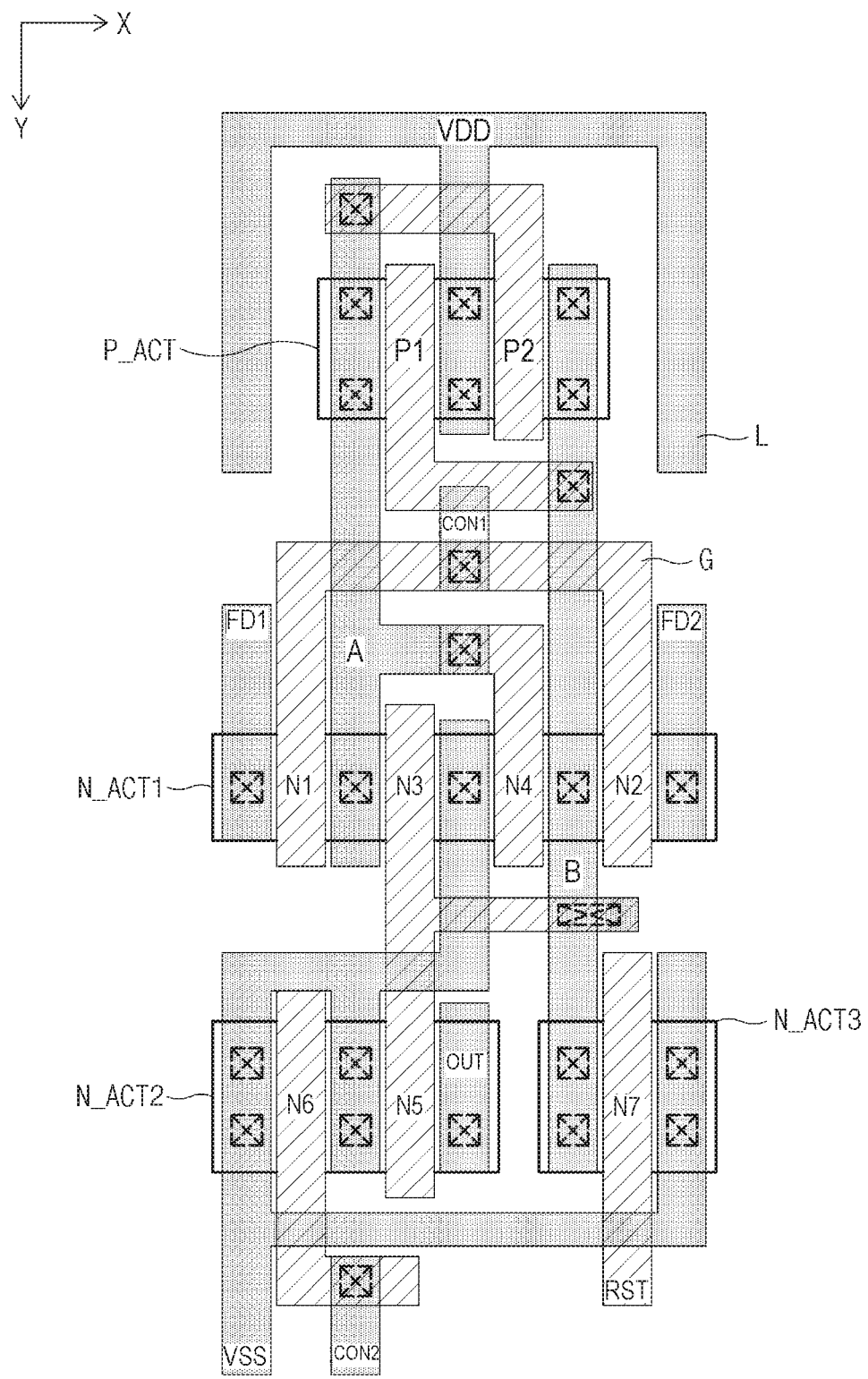
FIG. 5 shows a schematic diagram illustrating an actual layout structure of constituent elements contained in the fuse latch shown in FIG. 4, according to an embodiment of the present disclosure.

FIG. 5 shows a schematic diagram illustrating an actual layout structure of constituent elements contained in the fuse latch 2 shown in FIG. 4, according to an embodiment of the present disclosure.

For convenience of description and better understanding of the present disclosure, reference numerals indicating the PMOS transistors P1 and P2 and the NMOS transistors N1 to N7 of FIG. 4 are illustrated in gates of the corresponding transistors as shown in FIG. 5.

Referring to FIG. 5, the PMOS transistors P1 and P2 of the latch circuit 20 may be formed in a single P-type active region P_ACT. In other words, for an embodiment, the two PMOS transistors P1 and P2 contained in the two inverters INV1 and INV2, respectively, may share a single active region P_ACT.

For an embodiment, the NMOS transistors N1 and N2 of the fuse information transmission circuit 10 and the NMOS transistors N3 and N4 of the latch circuit 20 may be formed to share a single N-type active region N_ACT1. The NMOS transistors N5 and N6 of the data output circuit 30 may be formed to share another N-type active region N_ACT2. In addition, the NMOS transistor N7 of the initialization circuit 40 may be formed in still another N-type active region N_ACT3.

In this case, the N-type active region N_ACT1 may be located at one side of a P-type active region P_ACT in a first direction (Y-axis direction), and each of the N-type active regions N_ACT2 and N_ACT3 may be located at one side (i.e., an opposite side of the P-type active region P_ACT) of the N-type active region N_ACT1 in the first direction. The N-type active regions N_ACT2 and N_ACT3 may be arranged parallel to each other in a second direction (X-axis direction) perpendicular to the first direction. The N-type active region N_ACT3 may act as the dummy active region DUMMY_ACT shown in FIG. 2.

In other words, in the unit fuse latch 2 of FIG. 5, three N-type active regions N_ACT1, N_ACT2, and N_ACT3 may be arranged in a two-stage structure at one side of the P-type active region P_ACT1.

In the second direction, a total length of the arrangement structure of the N-type active regions N_ACT2 and N_ACT3 may be identical to the length of the N-type active region N_ACT1.

Figure 6:
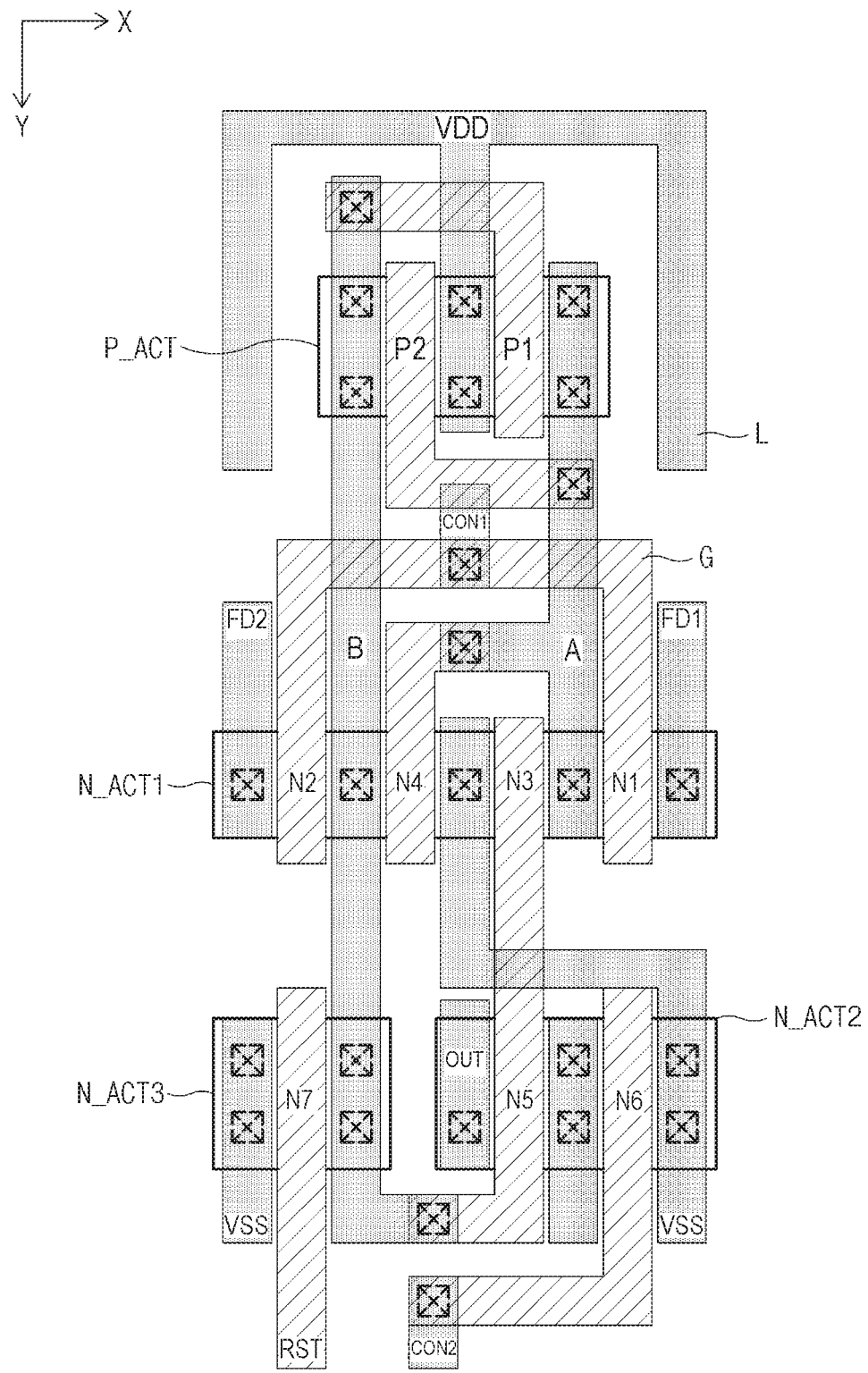
FIG. 6 shows a schematic diagram illustrating an actual layout structure of constituent elements contained in the fuse latch shown in FIG. 4, according to an embodiment of the present disclosure.

FIG. 6 shows a schematic diagram illustrating an actual layout structure of constituent elements contained in the fuse latch 2 shown in FIG. 4, according to an embodiment of the present disclosure.

Compared with the layout structure of FIG. 5, the layout structure of FIG. 6 illustrates a case in which positions of the N-type active regions N_ACT2 and N_ACT3 are interchanged with each other such that positions of transistors and the connection relationship of metal lines (L) may be partially changed. That is, the active regions and transistors shown in FIG. 6 may be arranged with bilateral symmetry with respect to the active regions and transistors shown in FIG. 5.

As illustrated in FIGS. 5 and 6, assuming that three N-type active regions N_ACT1, N_ACT2, and N_ACT3 are arranged in a two-stage structure at one side of the P-type active region P_ACT1, the positions of the N-type active regions N_ACT2 and N_ACT3 may be interchanged with each other.

Likewise, positions of the N-type active region N_ACT2 and the dummy active region DUMMY_ACT shown in FIG. 2 may also be interchanged with each other as necessary.

As is apparent from the above description, embodiments of the present disclosure may improve a structure of a fuse latch, resulting in increased regional gain.

Those skilled in the art will appreciate that embodiments may be carried out in other specific ways to those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A fuse latch of a semiconductor device comprising:
   first and second NMOS transistors, each of which is configured to receive a first control signal through its gate terminal and to transmit fuse cell data in response to the first control signal;
   a first inverter comprising a first PMOS transistor and a third NMOS transistor that are coupled in series between a power-supply voltage and a ground voltage, the first inverter configured to include an output node coupled to the first NMOS transistor and to include an input node coupled to the second NMOS transistor;
   a second inverter comprising a second PMOS transistor and a fourth NMOS transistor that are coupled in series between the power-supply voltage and the ground voltage, the second inverter configured to include an input node coupled to the output node of the first inverter and to include an output node coupled to the input node of the first inverter;
   a fifth NMOS transistor comprising a gate terminal coupled to the input node of the first inverter and coupled to the output node of the second inverter and comprising a first terminal coupled to a data output terminal; and
   a sixth NMOS transistor configured to receive a second control signal through its gate terminal and configured to selectively couple the ground voltage to a second terminal of the fifth NMOS transistor in response to the second control signal,
   wherein the first and second PMOS transistors are formed in a first active region, the first to fourth NMOS transistors are formed in a second active region located at one side of the first active region in a first direction, and the fifth and sixth transistors are formed in a third active region located at one side of the second active region in the first direction.

2. The fuse latch of the semiconductor device according to claim 1, wherein:
   the first NMOS transistor and the second NMOS transistor are respectively arranged at both ends of the second active region; and
   the third and fourth NMOS transistors are arranged between the first NMOS transistor and the second NMOS transistor within the second active region.

3. The fuse latch of the semiconductor device according to claim 1, further comprising:
   a first power-supply line located at both sides of the first active region, the first power-supply line configured to supply the power-supply voltage; and
   a second power-supply line coupled to one end of the third active region through a contact, the second power-supply line configured to supply the ground voltage.

4. The fuse latch of the semiconductor device according to claim 3, further comprising:
   a dummy active region located at one side of the third active region in a second direction substantially perpendicular to the first direction, the dummy active region comprising a dummy NMOS transistor.

5. The fuse latch of the semiconductor device according to claim 4, wherein both ends of the dummy active region are coupled to the second power-supply line.

6. The fuse latch of the semiconductor device according to claim 3, further comprising:
   a seventh NMOS transistor configured to receive a reset signal through its gate terminal, the seventh NMOS transistor coupled between the input node of the first inverter and the ground voltage.

7. The fuse latch of the semiconductor device according to claim 6, wherein the seventh NMOS transistor is formed in a fourth active region located at one side of the third active region in a second direction substantially perpendicular to the first direction.

8. The fuse latch of the semiconductor device according to claim 7, wherein one end of the fourth active region is coupled to the second power-supply line.

9. The fuse latch of the semiconductor device according to claim 1, wherein both ends of the second active region are coupled to the first NMOS transistor and the second NMOS transistor, respectively, through a contact.

10. A fuse latch of a semiconductor device comprising a plurality of PMOS transistors and a plurality of NMOS transistors to latch fuse cell data,
wherein the plurality of PMOS transistors are formed in a single P-type active region, and the plurality of NMOS transistors are formed in a plurality of N-type active regions,
wherein the plurality of N-type active regions are arranged in a two-stage structure at one side of the P-type active region.

11. The fuse latch according to claim 10, wherein the plurality of N-type active regions comprises:
a first N-type active region arranged at one side of the P-type active region in a first direction; and
a second N-type active region arranged at one side of the first N-type active region in the first direction.

12. The fuse latch according to claim 11, wherein the plurality of N-type active regions further comprises:
a third N-type active region located at one side of the second N-type active region in a second direction substantially perpendicular to the first direction.

* * * * *